United States Patent
Karp et al.

(10) Patent No.: US 8,134,813 B2
(45) Date of Patent: Mar. 13, 2012

(54) METHOD AND APPARATUS TO REDUCE FOOTPRINT OF ESD PROTECTION WITHIN AN INTEGRATED CIRCUIT

(75) Inventors: James Karp, Saratoga, CA (US);
Richard C. Li, Cupertino, CA (US);
Fu-Hing Ho, San Francisco, CA (US);
Mohammed Fakhruddin, Campbell, CA (US)

(73) Assignee: Xilinx, Inc., San Jose, CA (US)

( * ) Notice: Subject to any disclaimer, the term of this patent is extended or adjusted under 35 U.S.C. 154(b) by 494 days.

(21) Appl. No.: 12/362,471

(22) Filed: Jan. 29, 2009

(65) Prior Publication Data

US 2010/0188787 A1    Jul. 29, 2010

(51) Int. Cl.
*H02H 9/00* (2006.01)

(52) U.S. Cl. .......................... 361/56; 361/111
(58) Field of Classification Search ............... 361/56
See application file for complete search history.

(56) References Cited

U.S. PATENT DOCUMENTS

| | | | |
|---|---|---|---|
| 6,046,087 A | 4/2000 | Lin et al. | |
| 6,274,909 B1 | 8/2001 | Chang et al. | |
| 6,369,994 B1 * | 4/2002 | Voldman | 361/56 |
| 6,433,983 B1 | 8/2002 | Fechner | |
| 6,476,449 B1 | 11/2002 | Lin | |
| 6,867,957 B1 | 3/2005 | Tong et al. | |
| 7,250,660 B1 * | 7/2007 | Huang et al. | 257/355 |
| 7,358,574 B2 | 4/2008 | Choi | |
| 2004/0052019 A1 * | 3/2004 | Liu et al. | 361/56 |
| 2005/0045952 A1 * | 3/2005 | Chatty et al. | 257/355 |
| 2007/0008667 A1 | 1/2007 | Steinhoff | |
| 2008/0258263 A1 | 10/2008 | Gee et al. | |

OTHER PUBLICATIONS

Lesea, Austin and Alfke, Peter, Application Note: Hot-Swapping Virtex-II, Virtex-II Pro, Virtex-4, and Virtex-5 Devices, XAPP251 (v1.3.1) May 14, 2007, 7 pages, Xilinx, Inc. 2100 Logic Drive, San Jose, CA 95124.
Hayashi, et al., ESD Protection Design Using a Mixed-Mode Simulation for Advanced Devices, ESD Association, EOS/ESD Symposium (2004), 4 pages.

* cited by examiner

*Primary Examiner* — Jared Fureman
*Assistant Examiner* — Tien Mai
(74) *Attorney, Agent, or Firm* — Scott Hewett; John J. King

(57) ABSTRACT

An input/output ("I/O") circuit has a first N-channel metal-oxide semiconductor ("NMOS") field-effect transistor ("FET") coupled to the input pin with a silicide block. A first P-channel metal-oxide semiconductor ("PMOS") FET is directly connected to the input pin, with its N-well electrically coupled to an ESD well bias circuit. An NMOS low-voltage differential signal ("LVDS") driver is also directly connected to the input pin, and has cascaded NMOS FETs. The first NMOS FET of the LVDS driver is fabricated within a first P-tap guard ring electrically coupled to ground and an N-well guard ring coupled to the ESD well bias. The second NMOS FET of the LVDS driver is fabricated within a second P-tap guard ring electrically coupled to ground.

20 Claims, 6 Drawing Sheets

METHOD AND APPARATUS TO REDUCE FOOTPRINT OF ESD PROTECTION WITHIN AN INTEGRATED CIRCUIT

FIELD OF THE INVENTION

This invention relates generally to integrated circuits ("ICs"), and more particularly to techniques for protecting components in an input/output ("I/O") circuit from electrostatic discharge ("ESD").

BACKGROUND OF THE INVENTION

Many ICs are made up of millions of interconnected devices, such as transistors, resistors, capacitors, and diodes, on a single chip of semiconductor substrate. Complementary metal-oxide semiconductors ("CMOS") circuits and fabrication technology are commonly used in complex ICs. CMOS circuits use P-channel metal-oxide semiconductor ("PMOS") and N-channel metal-oxide semiconductor ("NMOS") devices to implement functions such as logic and input/output ("I/O") blocks.

An I/O block is a circuit in an IC that receives or sends data from or to other ICs. Signals can be differential (i.e., a HI/LOW or LOW/HI signal is simultaneously provided on differential I/O pins) or single-ended (i.e., either a HI signal or a LOW signal is provided on a single pin). In some ICs, I/O blocks can operate on either differential signals or on single-ended signals. When the I/O block operates in differential mode, an on-die differential termination is provided to terminate the differential path with an appropriate impedance (load resistor). When the I/O block operates in single ended mode, the differential termination is turned off.

I/O pads are often user-accessible, which makes components in the I/O circuit susceptible to damage from electrostatic discharge ("ESD"). ICs with I/O circuits typically must pass an ESD specification wherein a human body model ("HBM"), a machine model ("MM"), or a charged device model ("CDM") is charged to a specified voltage (e.g., a few kV for an HBM, 100-200 V for a MM, or several hundred Volts for a CDM) and then discharged onto the I/O pad. The inrush of current occurring when a charged HBM or CDM is connected to a pad of the I/O block can destroy components, such as field-effect transistors ("FETs"), and damage or destroy the functionality of the I/O circuit. Several techniques have been developed to protect against ESD damage.

An ESD can be a negative voltage or a positive voltage, relative to circuit ground. In a CMOS I/O circuit, ESD protection to both the PMOS devices and the NMOS devices is used. One technique is to connect one ESD element (e.g., diode or silicon-controlled rectifier ("SCR")) between a pad and ground, and another ESD element between the pad and a voltage supply, such as Vcco, to discharge current associated with a positive or negative ESD event ("zap"). Techniques using an SCR(s) often include a resistor in series between the SCR and data input, which develops bias voltage to trigger the SCR during an ESD event, but also degrades signal discrimination.

Another approach uses an SCR in parallel with a diode between ground and the input pin. A series resistor between the SCR and downstream circuit elements biases the SCR to discharge if a positive (voltage) ESD event occurs, and the diode discharges current in reverse breakdown if a negative ESD event occurs (or vice versa). However, the series resistor also degrades signal strength during normal operation.

Conventional ESD elements are relatively big in order to handle the discharge current without being damaged. Differential drivers are often low-voltage and relatively weak (small) devices requiring ESD protection in addition to the protection for the single-ended drivers in a differential/single selectable I/O. In ICs having a relatively high number of I/O pads, such as field-programmable gate arrays ("FPGAs"), providing ESD protection to all components for I/Os susceptible to ESD damage consumes considerable silicon area.

Another approach is to use silicide blocking techniques, which basically increases impedance for the drain current (e.g., similar to a ballast resistor) so that current from an ESD event is conducted from the drain of the FET into the well or substrate and further to ground or Vcco pins.

ESD protection with reduced silicon area for I/O circuit components is desirable.

SUMMARY OF THE INVENTION

An I/O circuit has a first NMOS FET coupled to the input pin with a silicide block. A first PMOS FET is directly connected to the input pin, with its N-well electrically coupled to an ESD well bias circuit. An NMOS low-voltage differential signal ("LVDS") driver is also directly coupled to the input pin, and has cascaded NMOS FETs. The first NMOS FET of the LVDS driver is fabricated within a first P-tap guard ring electrically coupled to ground and an N-well guard ring coupled to the ESD well bias. The second NMOS FET of the LVDS driver is fabricated within a second P-tap guard ring electrically coupled to ground.

A method of discharging an ESD event on an input pin of an I/O circuit of an IC includes applying a high voltage to the input pin and coupling the high voltage to an ESD N-well bias circuit of the IC. The method also includes producing an ESD N-well bias voltage, coupling the ESD N-well bias voltage to an N-well of a PMOS single-ended driver having a PMOS FET with a first breakdown voltage between a first PMOS drain and the N-well, where the first PMOS drain is directly connected to the input pin. The method further includes coupling the high voltage to a first NMOS drain of an NMOS FET of an NMOS single-ended driver having a second breakdown voltage between the first NMOS drain and a substrate of the IC less than the first breakdown voltage. In addition, the method includes discharging the ESD event through the first NMOS drain to the substrate and further to the ground or Vcco pins of the package.

DETAILED DESCRIPTION OF THE DRAWINGS

Figure 1:
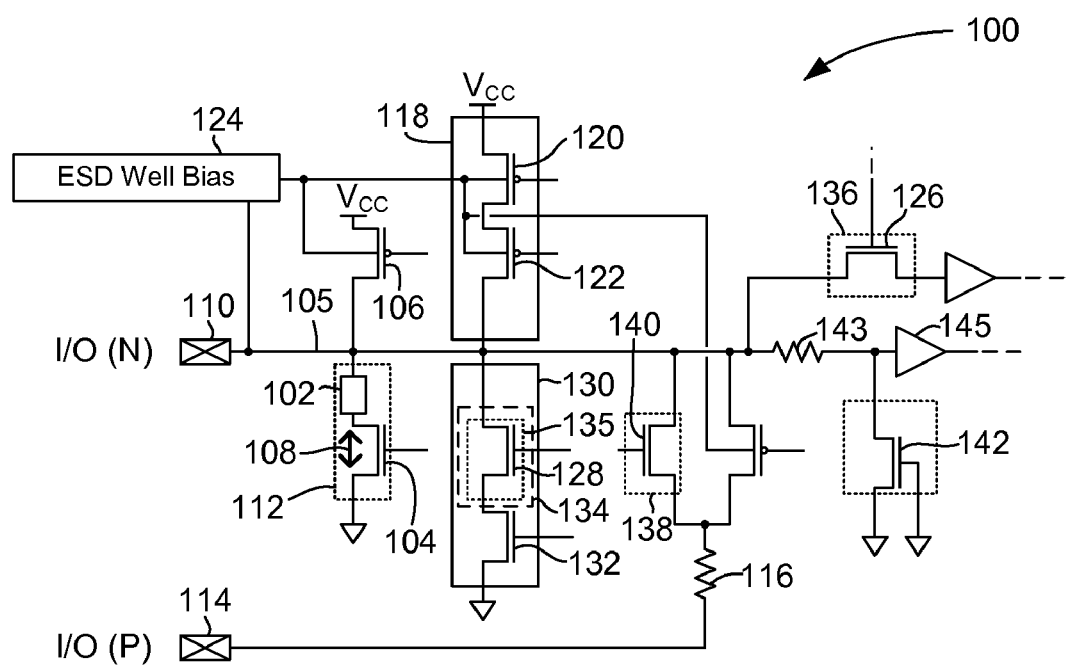
FIG. 1 is a circuit diagram of a portion of an I/O block using ESD protection according to an embodiment of the present invention.

FIG. 1 is a circuit diagram of a portion of an I/O circuit 100 of an IC using ESD protection according to an embodiment of the present invention. A silicide block ("SAB") 102 which provides ESD protection is only provided on the drain of the NMOS single-ended output driver 104 between the drain contact, routed to the input line 105 and that gate. The single-ended PMOS driver 106 is connected directly (i.e., without an intervening ESD element) to the input line 105. The PMOS devices and NMOS devices in the LVDS driver are protected from ESD damage by the I/O circuitry by appropriate well biasing (PMOS) and device selection (NMOS).

The NMOS single-ended output driver 104 is a high-current, low breakdown FET and in a particular embodiment has a gate width of at least four hundred microns and a breakdown voltage (between the drain and the substrate or well) of less than seven volts, whereas the gate width of the corresponding PMOS single-ended output driver 106 is greater or equal to five hundred microns and has a breakdown voltage greater than or equal to seven volts. In a particular embodiment, the breakdown voltage of the NMOS FET 104 is about 6 volts, and the breakdown voltage of the NMOS FET 128 is about 7 volts. The self-protecting design of the NMOS FET 104 allows greater current to be conducted without damage to the device, and the lower breakdown voltage insures that the NMOS FET will conduct the ESD current to protect the PMOS FETs and other NMOS FETs in the I/O circuit.

A silicide block 102 is included on the drain of the NMOS FET 104, and operates essentially as a ballast resistor to insure negative ESD events are discharged through the diode formed by the drain-substrate (or drain-well) junction. The well or substrate is typically grounded. Positive ESD events are discharged between the drain terminal and the source terminal, also grounded, through snap-back operation (the positive and negative currents between the drain and ground being represented by double-ended arrow 108). Thus, the combination of the silicide block 102 and lowered breakdown voltage of NMOS FET 104 (i.e., below the breakdown voltage(s) of other FETs susceptible to ESD damage in I/O circuit 100) protects both PMOS and other NMOS FETs from positive or negative ESD events.

In a particular embodiment, the wells of the PMOS devices in the I/O circuit 100, which are biased at $V_{CCO}$ or other positive on-chip supply level during normal operation, are biased to track the voltage at the input pad 110 if the pad voltage rises above $V_{CCO}$ ("ESD well biasing"). During an ESD event ("zap") on the input pad 110, the N-well of the PMOS single-ended output driver 106 is biased to essentially the same potential (voltage) of the input pad 110. This prevents significant current from flowing through, and damaging, the PMOS device. This also prevents the ESD potential from propagating inside the IC chip via the PMOS drain junction formed between the drain region of the N-well and the P-type substrate.

Tying the N-well potential to the input pad 110 allows the ESD potential at the input pad to build up until the drain of the NMOS single-ended driver 104 reaches its breakdown voltage. The NMOS driver goes into snapback mode, and discharges the ESD current (arrow 108). ESD protection is provided to the PMOS devices 106, 120, 122 because the breakdown voltage of the PMOS is higher than the breakdown voltage of the NMOS single-ended driver 104.

Several techniques are known in the art of CMOS semiconductor fabrication to lower the breakdown voltage of a FET terminal (e.g., drain of FET 104). In a particular embodiment, a P+ implant is used at the drain of the NMOS single-ended driver 104 to form a Zener-type diode between the N+ drain region and substrate, providing well-characterized reverse breakdown characteristics. The P+ implant is performed at a relatively high implantation energy to form an P+ region below a portion of the N+ drain, generally contacts to N+ drain separated from the gate/channel region(s) of the FET with not silicided N+, i.e., silicide blocking strip. An N-well guard 112 surrounds the NMOS FET 104 to prevent latch-up.

The I/O circuit 100 has a weak pull-up low-voltage differential signal ("LVDS") driver 118 that uses two PMOS FETs 120, 122 in cascade. The N-wells of the PMOS FETs 120, 122 in the weak pull-up LVDS driver 118 are coupled to the ESD well bias 124, as is the well of the PMOS single-ended driver 106. Biasing the wells of the PMOS FETs 106, 120, 122 according to high voltage on the input pad 110 insures that the PMOS N-wells are near the potential of the input pad 110 during an ESD event, and allows directly connecting the drains of the PMOS FETs 106, 122 to the input line 105 (i.e., without silicide blocking, or any other ESD device, between the drains of the PMOS FETs and the input line). Generally, the PMOS N-wells are biased at $V_{CCO}$ or other on-chip voltage during normal operation.

Similarly, silicide blocking is omitted from the $V_{REF}$ NMOS device 126 and from the NMOS FET 128 in the weak pull-down LVDS driver 130. The weak pull-down LVDS driver 130 uses cascaded NMOS FETs 128 and 132. An ESD N-well guard ring 134 and P-tap (substrate) guard ring 135_surrounds the NMOS FET 128 to block bipolar operation between the FETs 128, 132, as further described below in reference to FIGS. 3A and 3B. The ESD N-well guard ring 134 and P-type guard ring 135 in combination with the silicide block 102, cascaded FETs 128, 132, and selectively lowered breakdown voltage of NMOS FET 104 insures that ESD current is discharged only through NMOS FET 104, and not through the LVDS driver 130 or any other device connected to the input pad 110. This allows direct connection of the drains of the NMOS FETs 126, 128, 142 without silicide blocks, diodes, or other ESD protection. Grounded gate NMOS FET 142 operates as protection against a CDM event and is coupled between series resistor 143 and the sense amplifier 145.

I/O blocks with ESD protection in accordance with an embodiment had approximately half the silicon area requirement of a similar previous I/O block that used silicide blocks on all transistors connected to the input line. Embodiments of the invention are particularly desirable for use in FPGAs because FPGAs have relatively more I/O resources than other types of ICs, such as memory ICs and microprocessors, and the I/O circuits are often differential/single-ended selectable, which results in more components per I/O pad, hence more components needing ESD protection.

Figure 2:
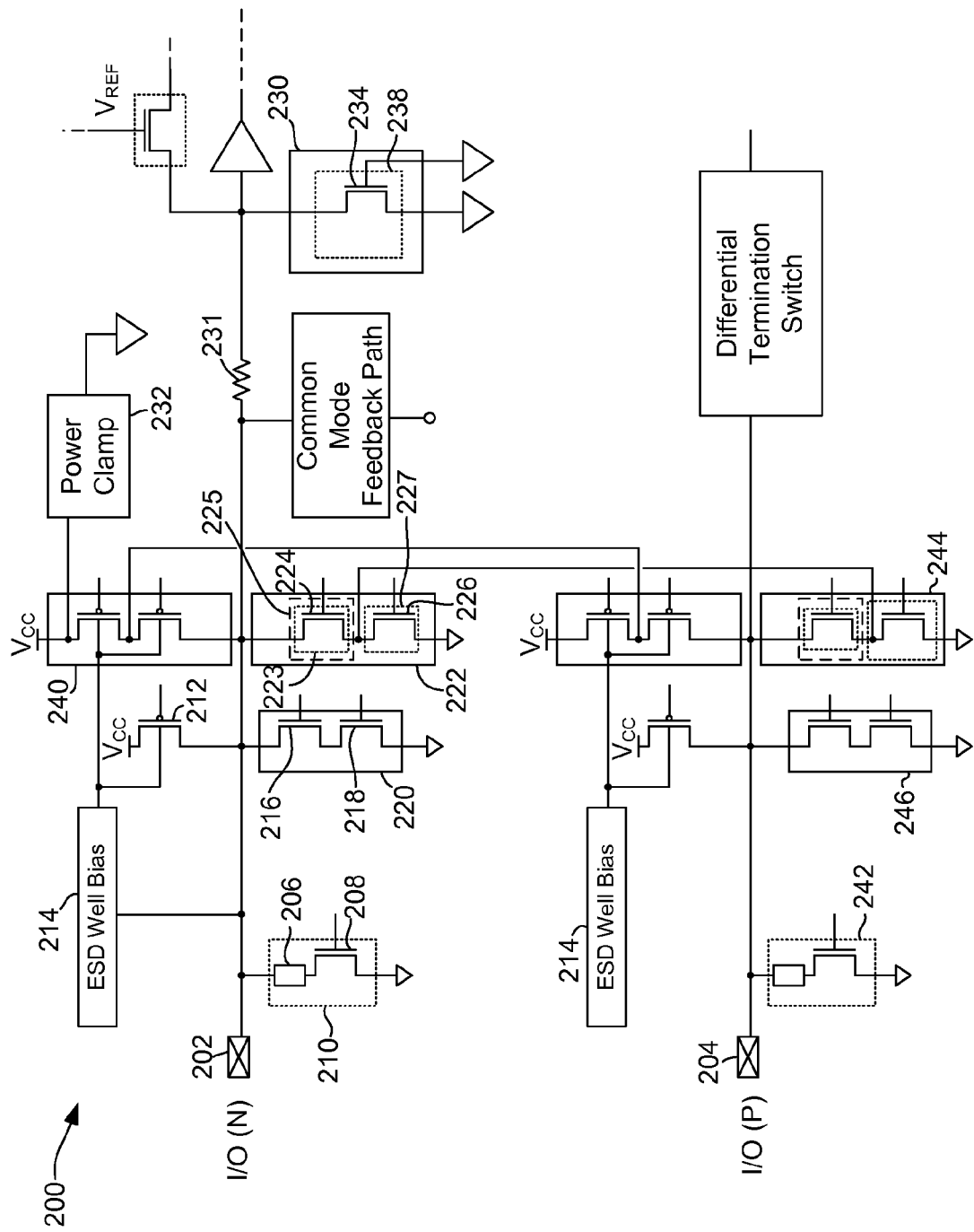
FIG. 2 is a circuit diagram of a portion of a differential I/O block according to an embodiment of the present invention.

FIG. 2 is a circuit diagram of a portion of a differential I/O circuit 200 according to an embodiment of the present invention. Differential input pins 202, 204 provide differential input signals, as are known in the art. One input pin 202 is connected to a circuit network and the other input pin 204 is also connected to a circuit network, and operation of each circuit network is similar. The input pin 202 is connected through a silicide blocking structure 206 to an NMOS single-ended driver 208 that is surrounded by an N-well guard ring 210. The NMOS FET 208 is a high-current, low-breakdown FET, as described above in reference to FIG. 1. A PMOS single-ended driver 212 is directly connected to the input pin 202 with its well connected to the ESD well bias circuitry 214. Cascaded NMOS FETs 216, 218 provide a weak pull-down circuit 220 in parallel with an NMOS LVDS driver 222 having NMOS FETs 224, 226, and has a similar layout design as driver 222, which is simplified in FIG. 2 for clarity of illustration.

Figure 3A:
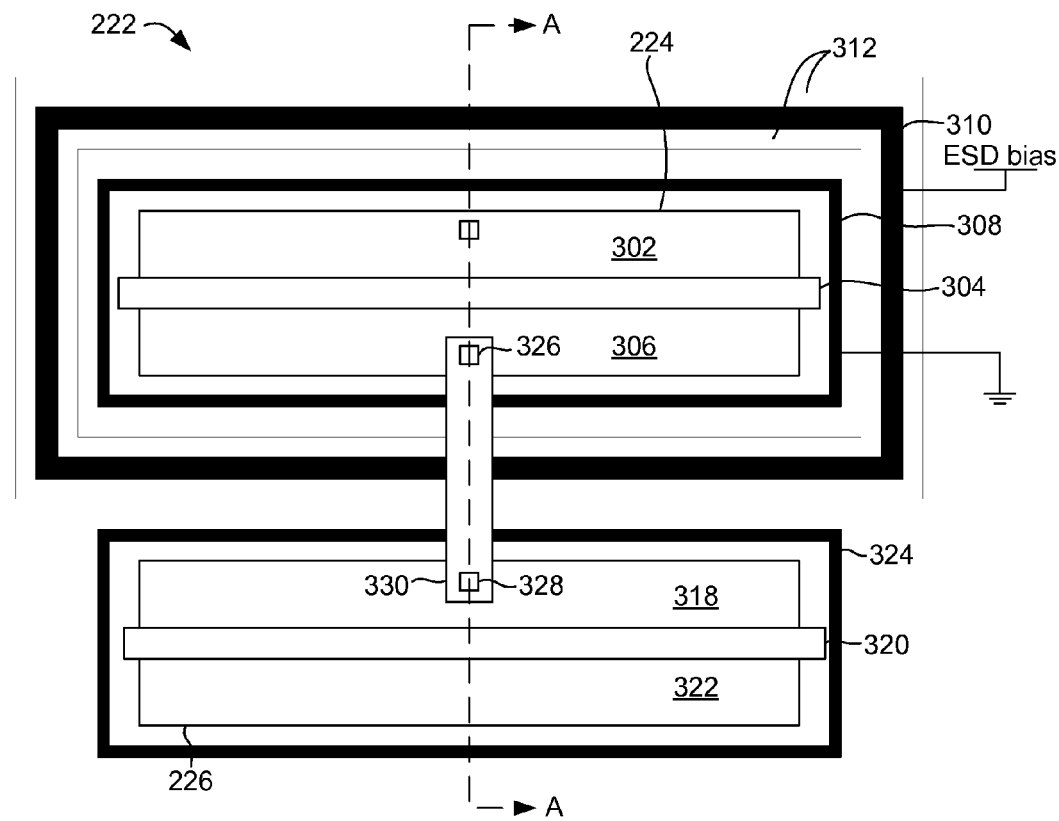
FIG. 3A is a plan view of a cascaded NMOS weak pull-down driver according to an embodiment of the present invention.
Figure 3B:
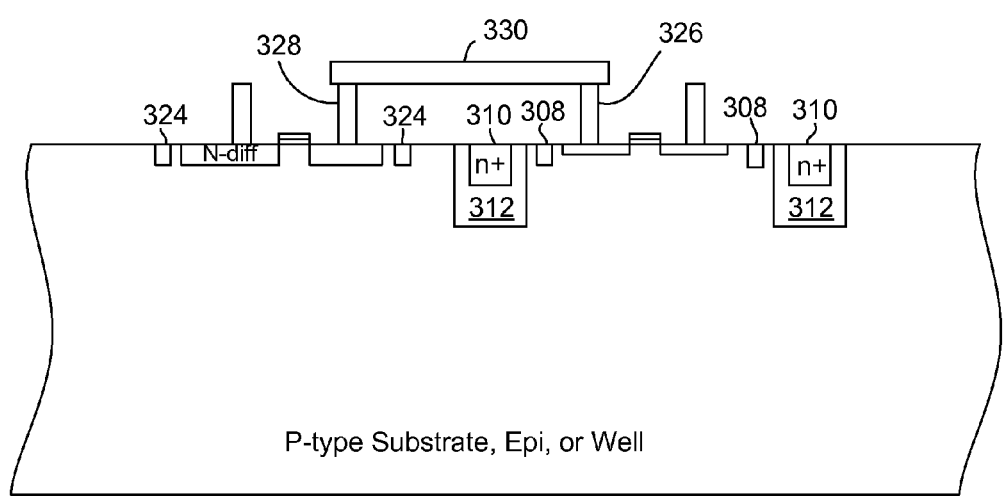
FIG. 3B is a cross section of the cascaded NMOS weak pull-down driver of FIG. 3A taken along section line A-A.

The drain of the NMOS FET 224 is directly connected to the input pin 202 of the I/O block and is surrounded with P-tap guard ring 223 surrounded by an N-tap guard ring 225 forming an anti-bipolar N-well ring tied to $V_{CCO}$ surrounding the NMOS FET 224 (see, FIGS. 3A and 3B). The source of the NMOS FET 224 is coupled to the drain of the NMOS FET 226, which is surrounded by a separate P-tap guard ring 227.

CDM protection circuit 230 and power clamp 232 both use relatively high-current grounded-gate NMOS FETs to provide additional protection by sourcing or sinking current. In a particular embodiment, the FET in the CDM protection circuit 230 has a gate width of about few tenths of microns within an N-well guard ring 238. The power clamp 232 is similar yet with gate width of about 400 microns.

The PMOS FETs in the PMOS LVDS driver 240 also have their wells connected to the ESD well bias circuitry 214, as described above in relation to FIG. 1, ref. num. 118, as do the PMOS FETs associated with the second input pin 204. The portion of the I/O circuit associated with the second input pin 204, such as the single-ended driver 242 and NMOS LVDS driver 244 and weak pull-down circuit 246, operates substantially as described above for the circuit associated with the first input pin 202, such as single-ended driver 210 and NMOS LVDS driver 222 and weak pull-down circuit 220.

FIG. 3A is a plan view of a cascaded NMOS LVDS driver 222 according to an embodiment of the present invention. Weak pull-down circuit 220 is similar and a detailed description of circuit 220 is therefore omitted. A first NMOS FET 224 has a drain region 302, a gate 304, and a source region 306 surrounded by a P-tap ring 308, which in a particular embodiment is connected to grounded substrate, epitaxial layer or P-well that the NMOS FET is fabricated in. An N-tap (i.e., N+) ring 310 that is tied to Vcco biases an N-well 312 ring that surrounds the P-tap ring 308.

A second NMOS FET 226 has a second drain region 318, a second gate 320, and a second source region 322 surrounded by a second P-tap guard ring 324, also connected to ground. The source 306 of the first NMOS FET 224 is electrically coupled to the drain 318 of the second NMOS FET 226, through contacts 326, 328 and a conductive trace 330 to form the cascaded NMOS LVDS driver 222 (see, FIG. 2; the NMOS LVDS driver 244 and associated pull-down 246 on the other input line is similarly fabricated). Separating the P-tap guard rings for each FET with an intervening N-well ring forms an anti-bipolar structure between the first FET 224 to prevent snap back from NMOS FET 224 to NMOS FET 226 during an ESD event, and allows surface or near-surface current generated by an ESD event to be collected by one guard ring or the other. The combination of the separate P-tap rings and intervening N-well ring maintains a relatively high breakdown strength for the cascaded NMOS LVDS driver, insuring current from an ESD event is conducted through the NMOS FET 104 of FIG. 1. Conventional cascaded NMOS FETs often share a common active area, and might be damaged during an ESD event without silicide blocking or other ESD protection.

FIG. 3B is a cross section of the cascaded NMOS weak pull-down driver 222 of FIG. 3A taken along section line A-A. The N-well ring 312 is biased through N-tap ring 310 and surrounds P-tap ring 308. Both the N-well ring 312 and ptaps ring 308 and 324 provide anti-bipolar barrier between 302 and 322. The contacts 326, 328 and conductive trace 330 couple the source of one NMOS FET with the drain of the cascaded NMOS FET.

Figure 4:
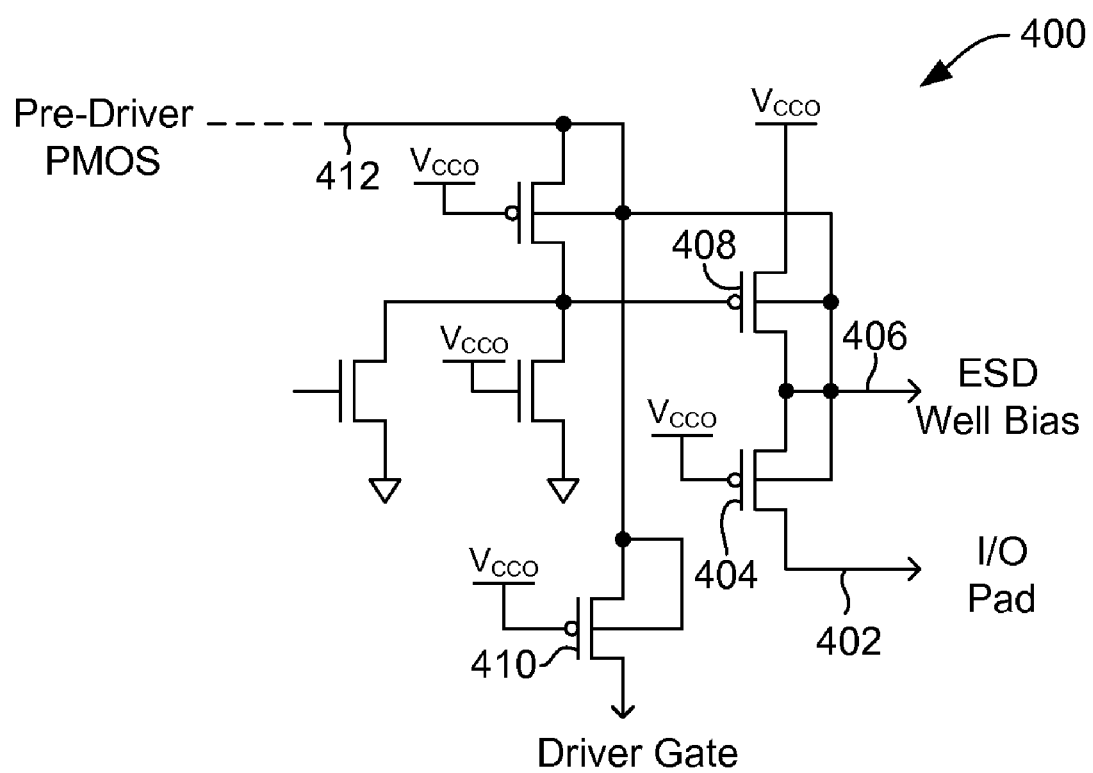
FIG. 4 is a diagram of a portion of an ESD well bias circuit according to an embodiment of the present invention.

FIG. 4 is a diagram of a portion of an ESD well bias circuit 400 according to an embodiment of the present invention. The I/O pad (e.g., pad 110 of FIG. 1) is coupled to the ESD well bias circuit (compare, FIG. 1, ref. num. 124). A PMOS FET 404 is gated by $V_{CCO}$ and conducts the I/O pad voltage to the ESD well bias 406 when the I/O pad voltage rises a selected amount above $V_{CCO}$. During normal operation, the ESD well bias is pulled to $V_{CCO}$. Another PMOS FET 408 prevents dump-back from the PMOS well bias 406 to $V_{CCO}$ during an ESD event. When I/O pad 402 rises above $V_{CCO}+V_{TH}$ (the threshold voltage of PMOS FET 404), the ESD well bias follows the input pad voltage. The driver gate is pulled through PMOS FET 410 and the pad voltage also controls the driver gate of the predriver buffer 412 to prevent contention between PMOS FETs 410 and 412.

Figure 5:
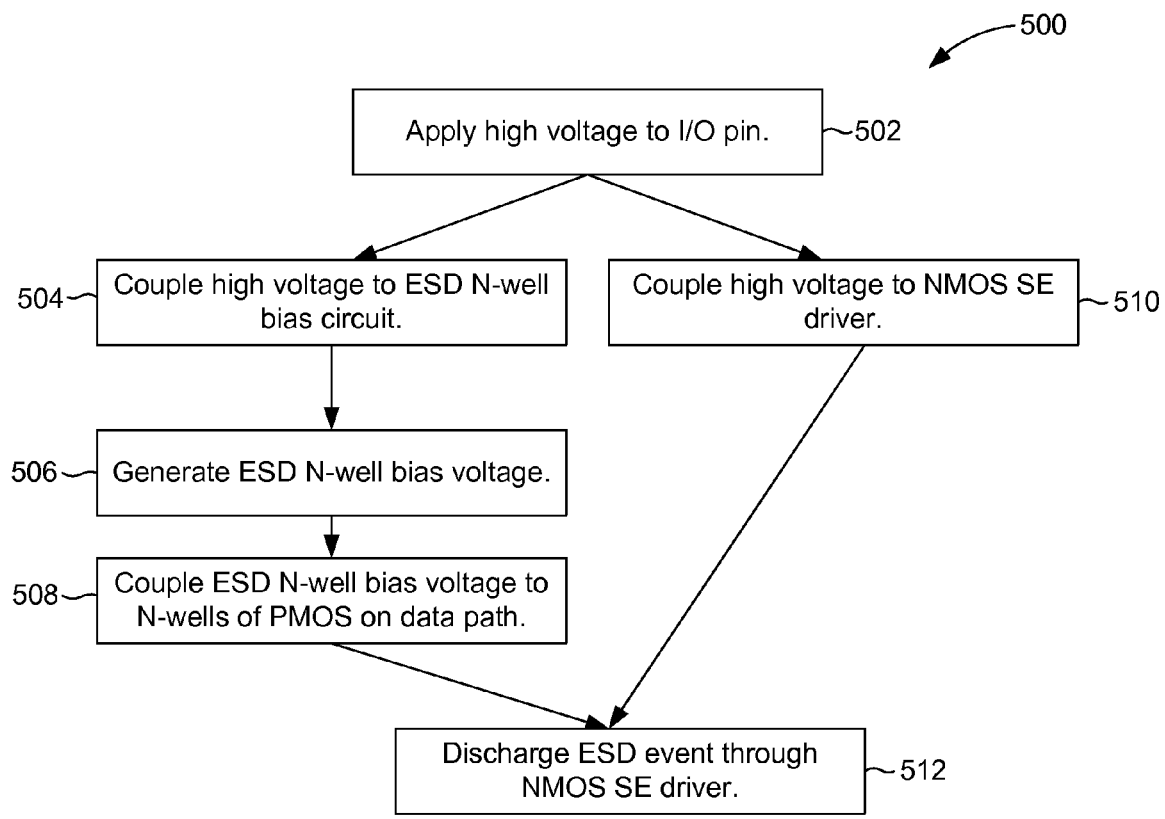
FIG. 5 is a flow chart of a method of discharging an ESD event on a pin of an input/output ("I/O") circuit of an IC according to an embodiment of the present invention.

FIG. 5 is a flow chart of a method 500 of discharging an ESD event on a pin of an input/output ("I/O") circuit of an IC according to an embodiment of the present invention. A high voltage either with respect to Vcco or with respect to ground is applied to the pin (step 502). In one embodiment, the high voltage is a test voltage of an HBM charged to an HBM test specification. In another embodiment, the high voltage is a test voltage of a MM charged to a MM test specification. In another embodiment, the high voltage is a test voltage of the IC device charged to a CDM test specification. In another embodiment, the high voltage is an electrostatic voltage generated by a user of the IC.

The high voltage is coupled to an ESD N-well bias circuit of the IC (step 504), and the ESD N-well bias circuit produces an ESD N-well bias voltage (step 506) that is coupled to an N-well of a PMOS single-ended driver or LVDS or pull-up (step 508) having PMOS FET with a first breakdown voltage between a first PMOS drain and the N-well, the first PMOS drain being directly connected to the input pin. In a particular embodiment, the ESD N-well bias voltage is approximately the high voltage minus a threshold voltage of an FET in the ESD N-well bias circuit.

The high voltage is also coupled to a first NMOS drain of an NMOS FET of an NMOS single-ended driver (step 510) having a second breakdown voltage between the first NMOS drain and a substrate of the less than the first breakdown voltage of PMOS directly connected to the pad. The ESD event is discharged through the first NMOS drain to a substrate or P-well of the IC (step 512) and eventually to ground or via power clamp to Vcco. In a particular embodiment, the NMOS FET has a breakdown voltage of about 6 volts, and the PMOS FET has a breakdown voltage of about 7 volts.

Figure 6:
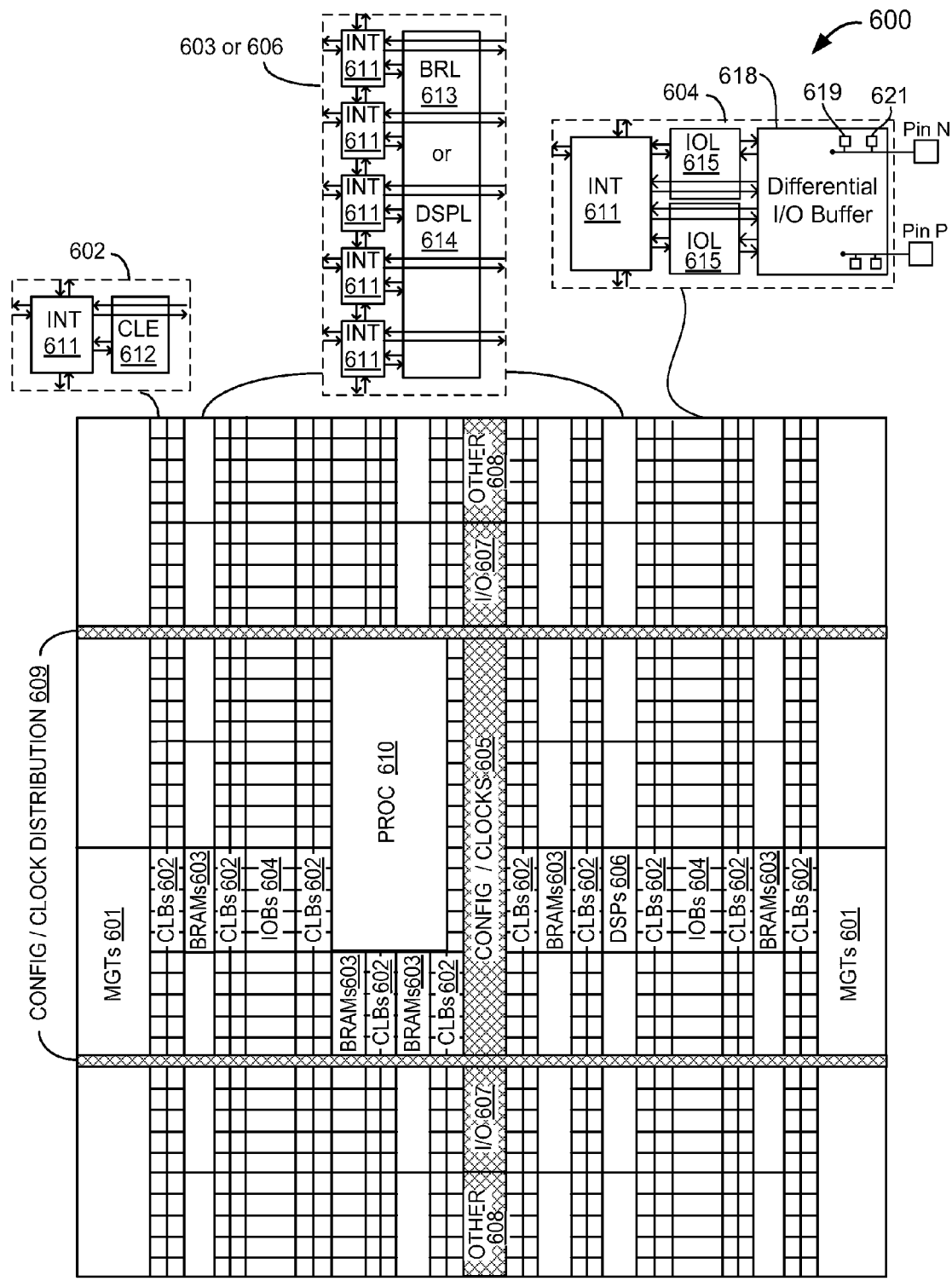
FIG. 6 is a plan view of an FPGA with I/O blocks according to an embodiment of the present invention.

FIG. 6 is a plan view of an FPGA 600 with I/O blocks according to an embodiment of the present invention. The FPGA is fabricated using a CMOS fabrication process and incorporates one or more differential I/O buffers according to one or more embodiments of the invention in one or more functional blocks. For example, ESD protection is provided in a differential I/O buffer 618 within I/O block 604 by using a silicide blocked high-current NMOS single-ended pull-down driver within an N-well guard ring 621, such as is described above with reference to FIGS. 1 and 2, operating in conjunction with an NMOS LVDS driver 619 substantially as described above with reference to FIGS. 2, 3A, and 3B.

The FPGA architecture includes a large number of different programmable tiles including multi-gigabit transceivers (MGTs 601), configurable logic blocks (CLBs 602), random access memory blocks (BRAMs 603), input/output blocks (IOBs 604), configuration and clocking logic (CONFIG/CLOCKS 605), digital signal processing blocks (DSPs 606), specialized input/output blocks (I/O 607) (e.g., configuration ports and clock ports), and other programmable logic 608 such as digital clock managers, analog-to-digital converters, system monitoring logic, and so forth. Some FPGAs also include dedicated processor blocks (PROC 610).

In some FPGAs, each programmable tile includes a programmable interconnect element (INT 611) having standardized connections to and from a corresponding interconnect element in each adjacent tile. Therefore, the programmable interconnect elements taken together implement the programmable interconnect structure for the illustrated FPGA. The programmable interconnect element (INT 611) also includes the connections to and from the programmable logic element within the same tile, as shown by the examples included at the top of FIG. 6.

For example, a CLB 602 can include a configurable logic element (CLE 612) that can be programmed to implement user logic plus a single programmable interconnect element (INT 611). A BRAM 603 can include a BRAM logic element (BRL 613) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 606 can include a DSP logic element (DSPL 614) in addition to an appropriate number of programmable interconnect elements. An IOB 604 can include, for example, two instances of an input/output logic element (IOL 615) in addition to one instance of the programmable interconnect element (INT 611). A differential I/O buffer 618 is also part of IOB 604. As will be clear to those of skill in the art, the actual I/O pads connected, for example, to the differential I/O buffer 618 are manufactured using metal layers above the various illustrated logic blocks, and typically are not confined to the area of the input/output differential I/O buffer 618. In the pictured embodiment, a columnar area near the center of the die is used for configuration, clock, and other control logic.

Some FPGAs utilizing the architecture illustrated in FIG. 6 include additional logic blocks that disrupt the regular columnar structure making up a large part of the FPGA. The additional logic blocks can be programmable blocks and/or dedicated logic. For example, the processor block PROC 610 shown in FIG. 6 spans several columns of CLBs and BRAMs.

Note that FIG. 6 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 6 are purely exemplary. For example, in an actual FPGA more than one adjacent column of CLBs is typically included wherever the CLBs appear, to facilitate the efficient implementation of user logic.

While the present invention has been described in connection with specific embodiments, variations of these embodiments will be obvious to those of ordinary skill in the art. For example, alternative layouts of unit cells, array cores, logic gates, and control devices and circuits could be alternatively used. Therefore, the spirit and scope of the appended claims should not be limited to the foregoing description.

The invention claimed is:

1. An integrated circuit ("IC") having an input/output ("I/O") circuit comprising:
    an input pin;
    a first N-channel metal-oxide semiconductor ("NMOS") field-effect transistor ("FET") having a first NMOS source and a first NMOS drain incorporating a silicide block electrically coupling the first NMOS FET to the input pin;
    a first P-channel metal-oxide semiconductor ("PMOS") FET having a first PMOS drain directly connected to the input pin, a first PMOS source electrically coupled to a positive voltage supply, and a PMOS N-well electrically coupled to the input pin through an electro-static discharge ("ESD") well bias circuit providing an ESD well bias voltage; and
    an NMOS low-voltage differential signal ("LVDS") driver having a second drain of a second NMOS FET directly connected to the input pin, the second NMOS FET fabricated within a first P-tap guard ring electrically coupled to ground, an N-well guard ring coupled to the ESD well bias voltage surrounding the first P-tap guard ring, and a second source of the second NMOS FET being electrically coupled to a third drain of a third NMOS FET fabricated within a second P-tap guard ring electrically coupled to ground and surrounding the third NMOS FET;
    wherein the first NMOS FET has a first NMOS breakdown voltage, the second NMOS FET has a second NMOS breakdown voltage greater than the first NMOS breakdown voltage, and the first PMOS FET has a first PMOS breakdown voltage greater than the first NMOS breakdown voltage.

2. The IC of claim 1 wherein the first NMOS FET comprises an NMOS single-ended output driver of the I/O circuit and the first PMOS FET comprises a PMOS single-ended output driver.

3. The IC of claim 2 wherein the first NMOS FET has a first NMOS FET gate width and the first PMOS FET has a first PMOS FET gate width less than the first NMOS FET gate width.

4. The IC of claim 1 further comprising a weak pull-down circuit having a fourth drain of a fourth NMOS FET directly connected to the input pin.

5. The IC of claim 1 wherein the first NMOS breakdown voltage is less than seven volts, and the second NMOS breakdown voltage and the first PMOS breakdown voltage are greater than seven volts.

6. The IC of claim 1 wherein the first PMOS breakdown voltage is at least 1.2 volts greater than the first NMOS breakdown voltage.

7. The IC of claim 1 wherein the first NMOS FET has a first NMOS gate width and the first PMOS FET has a first PMOS gate width less than the first NMOS gate width.

8. The IC of claim 1 wherein the drain of the first NMOS FET further includes a buried P-type implant.

9. The IC of claim 1 further comprising a PMOS LVDS driver having a second PMOS FET with a second PMOS drain directly connected to the input pin and having a second PMOS N-well coupled to the ESD well bias voltage.

10. The IC of claim 1 wherein the ESD well bias circuit biases the PMOS well to a voltage greater than the positive voltage supply when an input voltage on the input pin exceeds the positive voltage supply by at least a threshold voltage of the first PMOS FET.

11. A method of discharging an electrostatic discharge ("ESD") event on an input pin of an input/output ("I/O") circuit of an integrated circuit ("IC") comprising:
    applying a high voltage associated with the ESD event to the input pin;
    coupling the high voltage to an ESD N-well bias circuit of the IC;
    producing an ESD N-well bias voltage;
    coupling the ESD N-well bias voltage to an N-well of a PMOS single-ended driver having a PMOS FET with a first breakdown voltage between a first PMOS drain and the N-well, the first PMOS drain being directly connected to the input pin;

coupling the high voltage to a first NMOS drain of an NMOS FET of an NMOS single-ended driver having a second breakdown voltage between the first NMOS drain and a substrate of the IC less than the first breakdown voltage; and discharging the ESD event through the first NMOS drain to the substrate.

12. The method of claim 11 wherein the high voltage is a test voltage of a human body model specification, a machine model specification, or a charged device model specification.

13. The method of claim 11 wherein the high voltage is an electrostatic voltage generated by a user of the IC.

14. The method of claim 11 wherein the ESD event is a positive voltage event discharged from the first NMOS drain to bulk semiconductor by reverse bias breakdown.

15. The method of claim 11 where the ESD event is a negative voltage event discharged from the first NMOS drain through a first NMOS source of the NMOS FET in a snapback event.

16. The method of claim 15 wherein the ESD event is discharged through a silicide blocking portion of the first NMOS drain.

17. The method of claim 11 wherein the first breakdown voltage is at least one volt greater than the second breakdown voltage.

18. The method of claim 11 wherein the ESD N-well bias voltage is less than the high voltage by a threshold voltage of an FET in the ESD N-well bias circuit.

19. An integrated circuit ("IC") having an input/output ("I/O") circuit comprising:

an input pin;

a first N-channel metal-oxide semiconductor ("NMOS") field-effect transistor ("FET") having a first NMOS source and a first NMOS drain incorporating a silicide block electrically coupling the first NMOS FET to the input pin;

a first P-channel metal-oxide semiconductor ("PMOS") FET having a first PMOS drain directly connected to the input pin, a first PMOS source electrically coupled to a positive voltage supply, and a PMOS N-well electrically coupled to the input pin through an electro-static discharge ("ESD") well bias circuit providing an ESD well bias voltage;

an NMOS low-voltage differential signal ("LVDS") driver having a second drain of a second NMOS FET directly connected to the input pin, the second NMOS FET fabricated within a first P-tap guard ring electrically coupled to ground, an N-well guard ring coupled to the ESD well bias voltage surrounding the first P-tap guard ring, and a second source of the second NMOS FET being electrically coupled to a third drain of a third NMOS FET fabricated within a second P-tap guard ring electrically coupled to ground and surrounding the third NMOS FET; and a PMOS LVDS driver having a second PMOS FET with a second PMOS drain directly connected to the input pin and having a second PMOS N-well coupled to the ESD well bias voltage.

20. The IC of claim 19 wherein the first NMOS FET has a first NMOS breakdown voltage, the second NMOS FET has a second NMOS breakdown voltage greater than the first NMOS breakdown voltage, and the first PMOS FET has a first PMOS breakdown voltage greater than the first NMOS breakdown voltage.

\* \* \* \* \*